United States Patent [19]

Trueblood

[11] 4,293,587

[45] Oct. 6, 1981

[54] LOW RESISTANCE BACKSIDE PREPARATION FOR SEMICONDUCTOR INTEGRATED CIRCUIT CHIPS

[75] Inventor: Richard K. Trueblood, San Jose, Calif.

[73] Assignee: Zilog, Inc., Cupertino, Calif.

[21] Appl. No.: 959,344

[22] Filed: Nov. 9, 1978

[51] Int. Cl.$^3$ .......................................... H01L 21/285
[52] U.S. Cl. ........................................ 427/90; 29/590; 204/192 C; 228/123; 427/91; 427/96; 427/292; 427/309; 427/383.3; 427/383.9
[58] Field of Search ...................... 427/90, 91, 96, 292, 427/309, 383.3, 383.9; 204/192 C; 29/590; 228/123; 357/67, 71

[56] References Cited

U.S. PATENT DOCUMENTS

| | | | |
|---|---|---|---|
| 3,544,704 | 12/1970 | Glenn et al. ......................... | 357/67 |
| 3,650,826 | 3/1972 | Ganser ................................. | 427/90 |
| 3,665,594 | 5/1972 | Raithel ................................ | 228/123 |
| 3,702,787 | 11/1972 | Lowry et al. ........................ | 29/590 |
| 3,729,807 | 5/1973 | Fujiwara ............................. | 228/123 |
| 3,942,244 | 3/1976 | Flohrs et al. ......................... | 29/590 |
| 4,012,832 | 3/1977 | Crane .................................. | 29/590 |
| 4,023,725 | 5/1977 | Ivett et al. ........................... | 228/123 |
| 4,181,249 | 1/1980 | Peterson et al. ..................... | 29/590 |
| 4,233,103 | 11/1980 | Shaheen ............................. | 228/123 |

FOREIGN PATENT DOCUMENTS

| | | | |
|---|---|---|---|
| 48-13265 | 4/1973 | Japan .................................. | 427/90 |
| 54-152967 | 12/1979 | Japan .................................. | 427/89 |

*Primary Examiner*—John D. Smith
*Attorney, Agent, or Firm*—Limbach, Limbach & Sutton

[57] ABSTRACT

To provide an electrically conductive p-type wafer backside for semiconductor integrated circuit chips (die), a process is provided consisting of applying a thin layer of aluminum on a silicon dioxide free surface of the chip, followed by a layer of gold, then alloying the metals to diffuse the gold and traces of aluminum into the chip surface. The surface thus prepared can then be advantageously die attachable to a receiving surface by either eutectic alloy or conductive polymer techniques.

5 Claims, No Drawings

LOW RESISTANCE BACKSIDE PREPARATION FOR SEMICONDUCTOR INTEGRATED CIRCUIT CHIPS

BACKGROUND OF THE INVENTION

Many types of semiconductor integrated circuit chips (herein after called "chips"), particularly memory chips, require for their successful operation an electrically reliable backside contact to the receiving surface to which the chip is attached. Excessive resistance (especially if this electrical resistance varies with changes in temperature) may lead to erratic device performance, or even worse, the circuit may not operate at all due to backside bias voltage fluctuations. It therefore becomes vitally important to achieve as nearly as possible ohmic contact between the backside of the chip and the substrate or receiving surface. Unfortunately this condition is not easily achieved. In many cases contaminants from the wafer fabrication process, if not entirely removed, may provide a source of foreign atoms which "dope" the backside. Gold applied to the wafer backside or from the die attach material also lends an undesirable doping effect tending to alter p-silicon to n-type. There are other problems, less understood which in normal wafer fabrication also detrimentally affect backside contact, such as mechanical damage or inherent properties of the base material.

The above non-ohmic contact problems may be overcome by intentional elemental additions to the die attach preform material or directly to the wafer backside. In fact at least two such techniques are known and commonly used in the art. Borongold-silicon alloy die attach preforms are available and provide p-type doping to insure that p-silicon does not combine to form any unwanted n-junctions on the wafer backside. Similarly, phosphorus-gold-silicon, arsenic-gold-silicon, and vanadium-gold-silicon preforms insure that n-silicon does not combine with any p-type contaminants to form unwanted p-junctions. The other method of providing intentional doping makes use of ion implantation directly into the wafer backside, enriching the p-silicon with p-type ions or the n-silicon with additional n-type. These methods have proved to be only marginally successful however, in terms of the preform doping approach, and very costly if ion implantation is employed. The present invention overcomes completely the drawbacks of the prior art and offers a simplified method of obtaining essentially ohmic contact between silicon wafer backsides and a receiving surface or substrate, being equally advantageous in conventional gold-silicon eutectic alloy or conductive polymer die attachment.

SUMMARY OF THE INVENTION

In accordance with the teachings of the present invention, a low resistance chip backside surface is achieved which is suitable for eutectic alloy die attachment and particularly adapted to temperature stable conductive polymer attachment (e.g., silver filled polyimide). Such an attaching material may offer advantages in thermal stress relief when die attaching low thermal expansion silicon to high expansion substrate materials (e.g., copper base alloys commonly used as leadframe materials in plastic semiconductor packages).

According to the present invention, p-type silicon can be advantageously attached to a substrate utilizing a chip backside preparation process which eliminates the formation of unwanted n-junctions caused by gold silicon diffusion and other sources. The invention process has all the advantages of the prior art, but without the disadvantage of high cost, low material through-put and marginal results. These and other advantages of the invention will be further appreciated as the following specification is read.

DESCRIPTION OF THE PREFERRED EMBODIMENT

According to the present invention, the back surface of the chip is first freed of substantially all residuals which exist from the fabrication process of the chip itself. Cleaning aids in providing a surface substantially free of all n-type contaminants. Any known technique designed to remove silicon selectively from one surface of a chip may be employed such as grinding, sandblasting or chemical etching.

After the cleaning process has been carried out, the same chip surface is de-oxidized to remove substantially all silicon dioxide therefrom. This can be done in any known manner and it has been found that a bare silicon surface can be formed by exposing the cleaned chip surface to fuming hydrofluoric acid.

The electrically conductive p-type coating can then be applied to the cleaned and de-oxidized surface of the silicon chip. A very thin layer of aluminum is applied to the cleaned surface. Next, a layer of gold is applied to the aluminum layer, the gold layer having a substantially greater thickness (from 20:1 to 40:1) than the aluminum layer.

Once the gold and aluminum layers have been applied to the chip, they are metallurgically alloyed with each other and with the silicon by heating the semiconductor integrated circuit chip at a temperature high enough to reach a liquid state but low enough not to cause excessive degradation of electrical characteristics on the chip top surface. It has been found that alloying at a temperature range between approximately 380° C. and 440° C. for 4 to 6 minutes in a nitrogen atmosphere is sufficient to not only cause alloying, but to also cause the gold to be driven through the aluminum layer and to penetrate the silicon surface, pulling traces of aluminum therewith.

Gold and aluminum have been selected as the alloying materials by way of example. One skilled in the art would appreciate other group III elements which would behave electrically equivalent as p-type dopants. It should be noted, however, that materials must be selected which not only possess the proper electrical equivalencies, but which have metallurgical solubility between the group III elements selected and silicon; for there must be alloying between the metals and silicon in practicing the present invention.

Although aluminum is disclosed as an initial coating onto the silicon dioxide free surface, an aluminum-silicon alloy can be chosen in its place in practicing the present invention. The thickness of the aluminum containing layer is not critical, although it is found that the present invention can be practiced most advantageously with a layer from approximately 50 to 150 angstroms. As previously stated, the gold layer should be substantially thicker than the aluminum layer. In fact, the gold layer should be approximately 20 to 40 times thicker than the aluminum containing layer. Thus, it has been found to be most advantageous to carry out the present invention by applying a layer of gold over the aluminum containing surface to a thickness in the range of approximately 1,000 to 4,000 angstroms.

After the alloying takes place and migration of the metals into the silicon chip body occurs as recited above, the back surface of the chip is ideally suited for attachment by either a eutectic alloy or conductive polymer techniques. A preferred eutectic alloy is that of 98 weight percent gold—2 weight percent silicon, or other ratios of gold/silicon. A preferred conductive polymer is a low temperature cross-linked polyimide filled with a conductive material such as silver, 60–80% by volume.

I claim:

1. A process for preparing the surface of a semiconductor integrated circuit chip for conductive attachment to a receiving surface comprising removing substantially all surface contaminants and silicon dioxide from a surface of said chip, applying a layer of aluminum to said surface, applying a layer of gold to said aluminum layer, having a thickness in the range of twenty to forty times thicker than said aluminum layer, and alloying said aluminum and gold layers at a temperature range between 380° and 440° C. for a time of four to six minutes in a nitrogen atmosphere, whereby gold is driven through said aluminum layer to penetrate said silicon surface, pulling traces of aluminum therewith.

2. The process of claim 1 further comprising the step of contacting a conductive polymer to the alloyed gold layer.

3. The process of claim 1 wherein the metal layers are applied by sputtering, evaporation, and/or vapor deposition.

4. The process of claim 1 wherein said aluminum layer has a thickness in the range of 50 to 150 Å.

5. The process of claim 1 wherein the method of removing surface contaminants is selected from the group consisting of sandblasting, grinding and etching.

* * * * *